(12) United States Patent
Kinsman et al.

(10) Patent No.: US 7,148,083 B2
(45) Date of Patent: Dec. 12, 2006

(54) TRANSFER MOLD SEMICONDUCTOR PACKAGING PROCESSES

(75) Inventors: Larry Kinsman, Boise, ID (US); Richard Wensel, Boise, ID (US); Jeff Reeder, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/986,424

(22) Filed: Nov. 10, 2004

(65) Prior Publication Data

US 2005/0101061 A1 May 12, 2005

Related U.S. Application Data

(60) Continuation of application No. 10/286,658, filed on Nov. 1, 2002, which is a division of application No. 09/827,017, filed on Apr. 4, 2001.

(51) Int. Cl.
*H01L 21/66* (2006.01)
*H01L 21/00* (2006.01)

(52) U.S. Cl. .................... 438/106; 438/15; 438/25; 438/26; 438/51; 438/55; 438/64; 438/112; 438/124; 438/127

(58) Field of Classification Search ............ None
See application file for complete search history.

(56) References Cited

U.S. PATENT DOCUMENTS

| | | | |
|---|---|---|---|
| 4,556,896 A | 12/1985 | Meddles | |
| 5,144,412 A | 9/1992 | Chang et al. | 257/665 |
| 5,216,278 A | 6/1993 | Lin et al. | |
| 5,258,649 A | 11/1993 | Tanaka et al. | |
| 5,336,931 A * | 8/1994 | Juskey et al. | 257/787 |
| 5,571,071 A * | 11/1996 | Shapiro | 600/187 |
| 5,767,446 A | 6/1998 | Ha et al. | |
| 5,900,669 A | 5/1999 | Knapp et al. | |
| 5,953,589 A * | 9/1999 | Shim et al. | 438/106 |
| 6,048,755 A * | 4/2000 | Jiang et al. | 438/118 |
| 6,054,755 A * | 4/2000 | Takamichi et al. | 257/667 |
| 6,064,111 A | 5/2000 | Sota et al. | |
| 6,107,683 A | 8/2000 | Castro et al. | |
| 6,107,689 A | 8/2000 | Kozono | |
| 6,111,315 A | 8/2000 | Stearns et al. | |

(Continued)

FOREIGN PATENT DOCUMENTS

JP 404177753 A 6/1992

(Continued)

OTHER PUBLICATIONS

Merix Corporation, ABSTRACT: *Types of Soldermasks and Their Applications* (1997) 5 pages.

(Continued)

*Primary Examiner*—Carl Whitehead, Jr.
*Assistant Examiner*—James M. Mitchell
(74) *Attorney, Agent, or Firm*—Wells St. John P.S.

(57) ABSTRACT

In one implementation, a circuit substrate includes a substrate having opposing sides. At least one of the sides is configured for transfer mold packaging and has conductive traces formed thereon. A soldermask is received on the one side, and has a plurality of openings formed therethrough to locations on the conductive traces. The soldermask includes a peripheral elongated trench therein positioned on the one side to align with at least a portion of an elongated mold void perimeter of a transfer mold to be used for transfer mold packaging of the one side. In one implementation, the invention includes a transfer mold semiconductor packaging process. In one implementation, the invention includes a semiconductor package. In one implementation, the invention includes a ball grid array.

11 Claims, 7 Drawing Sheets

U.S. PATENT DOCUMENTS

| | | | |
|---|---|---|---|
| 6,214,645 B1 | 4/2001 | Kim | 438/110 |
| 6,221,690 B1 * | 4/2001 | Taniguchi et al. | 438/106 |
| 6,246,124 B1 | 6/2001 | Jimarez et al. | |
| 6,331,453 B1 | 12/2001 | Bolken et al. | |
| 6,365,979 B1 * | 4/2002 | Miyajima | 257/787 |
| 6,379,997 B1 | 4/2002 | Kawahara et al. | 438/106 |
| 6,452,113 B1 | 9/2002 | Dibene et al. | |
| 6,560,122 B1 | 5/2003 | Weber | |
| 6,580,620 B1 | 6/2003 | Kim | |
| 2001/0002321 A1 | 5/2001 | Castro | |
| 2001/0009301 A1 | 7/2001 | Azuma | |
| 2002/0001880 A1 | 1/2002 | Kobayashi | 438/127 |
| 2002/0074590 A1 | 6/2002 | Huang | |
| 2002/0149104 A1 | 10/2002 | Huang | |

FOREIGN PATENT DOCUMENTS

| | | |
|---|---|---|
| JP | 11-260954 A | 9/1999 |

OTHER PUBLICATIONS

Toshiba Chemical Corporation, *Technical Information: High Tg Epoxy Molding Compound for BGA Package*, KE-1100ARH (pre-Jul. 2000) 6 pages.

Tummata, Rao R. et al., *Plastic Packaging*, Microelectronics Packaging Handbook (Jan. 1997) pp. 560-589.

* cited by examiner

TRANSFER MOLD SEMICONDUCTOR PACKAGING PROCESSES

RELATED PATENT DATA

This patent resulted from a continuation application of U.S. patent application Ser. No. 10/286,658, filed Nov. 1, 2002, entitled "Transfer Mold Semiconductor Packaging Processes", naming Larry Kinsman, Richard Wensel and Jeff Reeder as inventors, the disclosure of which is incorporated by reference; which patent resulted from a divisional application of U.S. patent application Ser. No. 09/827,017, filed Apr. 4, 2001, entitled "Circuit Substrates, Semiconductor Packages, and Ball Grid Arrays", naming Larry Kinsman, Richard Wensel and Jeff Reeder as inventors, the disclosure of which is incorporated by reference.

TECHNICAL FIELD

This invention relates to semiconductor packaging processes, to circuit substrates, to semiconductor packages, and to ball grid arrays.

BACKGROUND OF THE INVENTION

Integrated circuitry chips are typically formed into packages, with the packages then being mounted or otherwise connected to other substrates and devices. Many different packaging methods and devices exist for integrated circuitry in the form of a semiconductor chip. One exemplary package mounts a semiconductor chip to another circuit substrate, for example a printed circuit board. The printed circuit board is typically fabricated to have a plurality of conductive traces formed thereon in desired patterns. An insulative layer referred to as a soldermask is then typically formed on the circuit substrate. Such layers are typically patterned to provide openings to locations on the circuit traces therebeneath. The soldermask typically prevents solder bridging on the circuit side of the assembly. The semiconductor chip is typically mounted to the circuit substrate by being adhered to the soldermask with a die attach adhesive. Conductive wire or other bonding is then conducted to connect the circuitry of the chip with the circuitry of the substrate.

Thereafter, in one exemplary packaging process, an insulative encapsulant material is provided to one side of the substrate over the semiconductor chip and soldermask. Such can be formed by a transfer molding process whereby a mold having a void is placed against the circuit substrate and an encapsulant caused to flow therein. The mold is ultimately removed and the encapsulant is allowed to cure.

One type of semiconductor packaging finding increasing use are ball grid arrays. Such can be fabricated as described above and additionally include conductive traces and a soldermask received on the opposing side of the circuit substrate from which the semiconductor die or chip is mounted. Openings are provided in the soldermask on the opposing side to desired locations of the opposing side circuit traces. An array of solder balls are mounted through the openings to surfaces of the conductive traces. The solder ball array serves to provide an electrical connection for the package with another substrate or device.

The current trend towards ball grid array and other semiconductor packaging has created a number of challenges. Among these are cracking of the soldermask on the circuit side of the substrate during encapsulation, and less than desirable adhesion of the encapsulant material to the underlying soldermask. Such can create defects in the package that can cause production yield losses and long-term reliability failures. Typical soldermasks used today comprise a polymeric material that is applied to the outer surfaces of the substrate to, among other things, protect the circuitry, define particular features (for example, solder ball pads), define plated areas and control solder wicking during the reflow of solders. Typical soldermask materials used today are relatively soft with low mechanical strength.

Traditionally, soldermask materials are used to cover all areas of a ball grid array substrate that are not specifically open to reveal some part of the underlying circuit. In the area of the perimeter of the mold body, the soldermask is typically used to protect the circuit traces from the clamping forces applied by the mold body and to form a level surface of the ball grid array substrate so that the mold body can form a good seal during encapsulation. Yet, clamping forces applied by the mold body to the ball grid array substrate can be quite high. In some cases, these forces can be in excess of four tons on a single ball grid array substrate strip. Because of these high clamping forces on the relatively soft character of the soldermask, high shear forces are induced in the soldermask. These shear forces can cause severe cracking of the soldermask. Cracks in the soldermask can cause a functional failure by severing the circuit traces below and, even if not, are a cosmetic defect that may cause such part to be rejected by the consumer.

It would be desirable to overcome these and other drawbacks associated with semiconductor packaging and packaging processes. Yet, the invention is limited only by the accompanying claims as literally worded and as appropriately interpreted in accordance with the doctrine of equivalents without any limitation being read therein with respect to objective or result.

SUMMARY

The invention comprises semiconductor packaging processes, circuit substrates, semiconductor packages, and ball grid arrays. In one implementation, a transfer mold semiconductor packaging process includes providing a circuit substrate having a semiconductor chip mounted to a side thereof. The circuit substrate has a soldermask on the side. The soldermask includes an elongated outer peripheral trench. A transfer mold is positioned to cover at least a portion of the circuit substrate having the chip mounted thereto. The transfer mold has a void within which the semiconductor chip is received. The void has a perimeter. The transfer mold is positioned such that at least a portion of the void perimeter is aligned over at least a portion of the soldermask peripheral trench. Encapsulant is flowed into the mold void over the semiconductor chip and to within the soldermask trench. After the flowing, the encapsulant is cured into a solidified mass.

In one implementation, a circuit substrate includes a substrate having opposing sides. At least one of the sides is configured for transfer mold packaging and has conductive traces formed thereon. A soldermask is received on the one side, and has a plurality of openings formed therethrough to locations on the conductive traces. The soldermask includes a peripheral elongated trench therein positioned on the one side to align with at least a portion of an elongated mold void perimeter of a transfer mold to be used for transfer mold packaging of the one side. In one implementation, the invention includes a semiconductor package. In one implementation, the invention includes a ball grid array.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
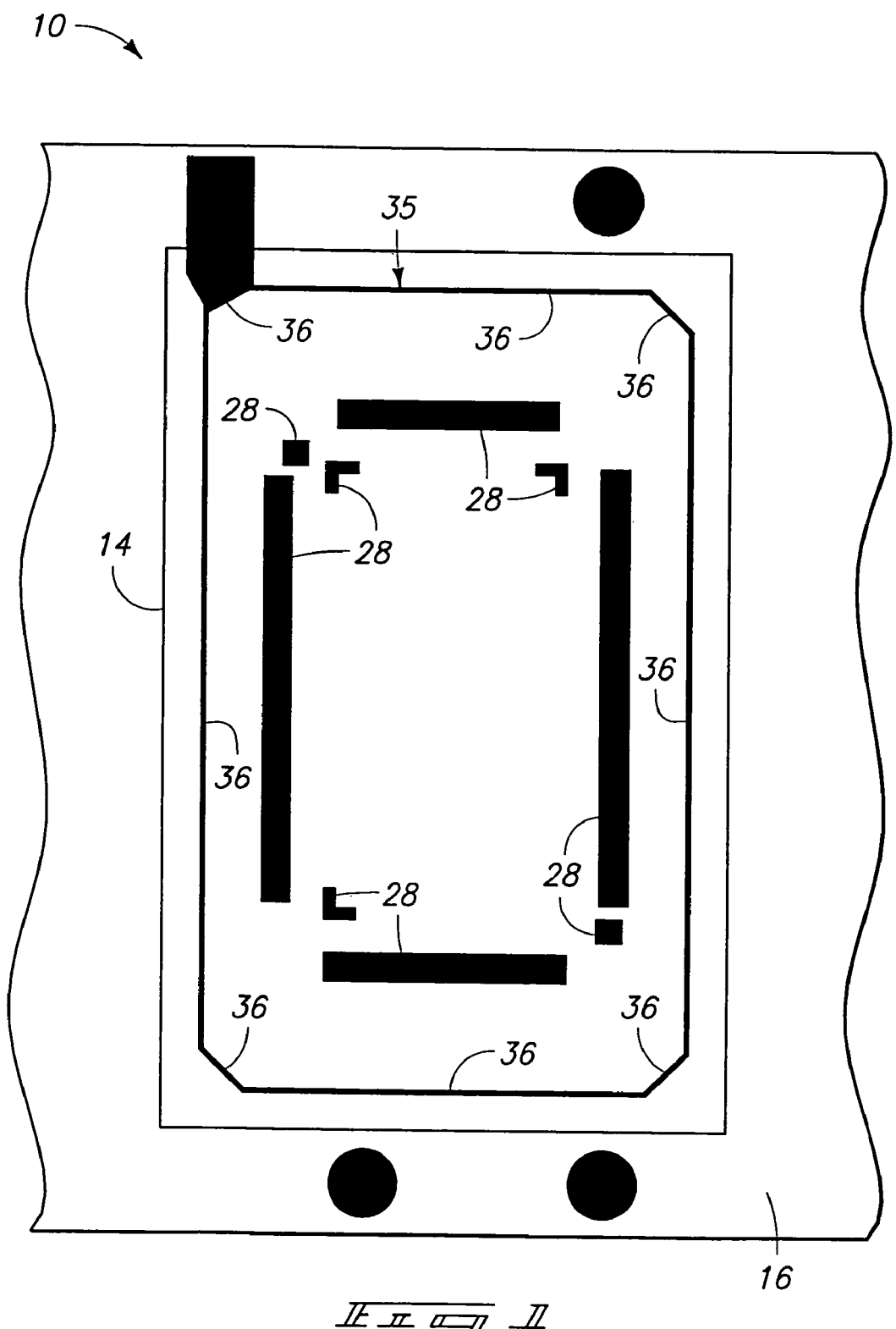
FIG. 1 is a top diagrammatic partial view of an exemplary circuit substrate showing aspects of a soldermask pattern in accordance with an aspect of the invention.
Figure 2:
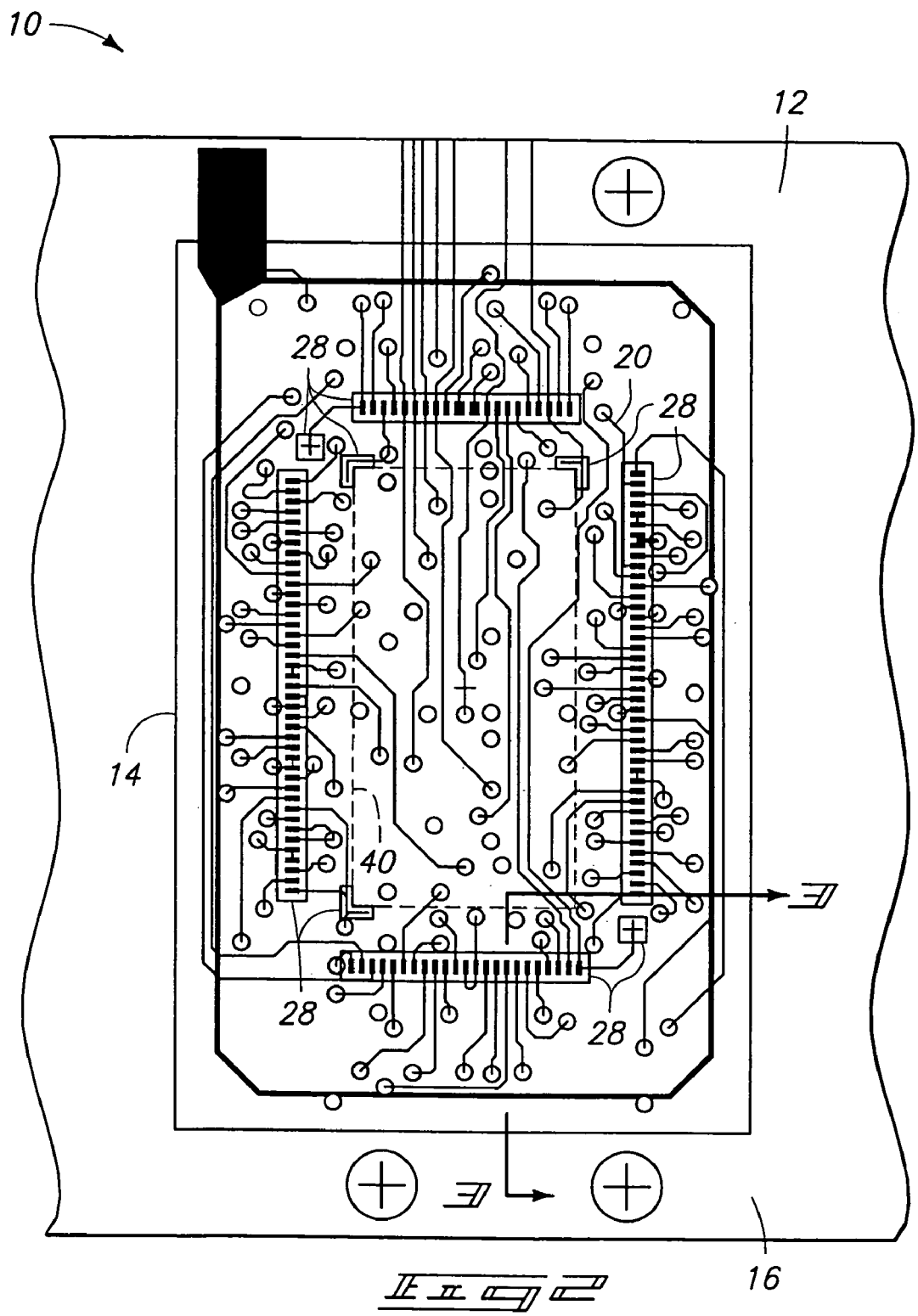
FIG. 2 is a view of the FIG. 1 substrate, also showing underlying circuit traces which are not shown in FIG. 1 for clarity.
Figure 3:
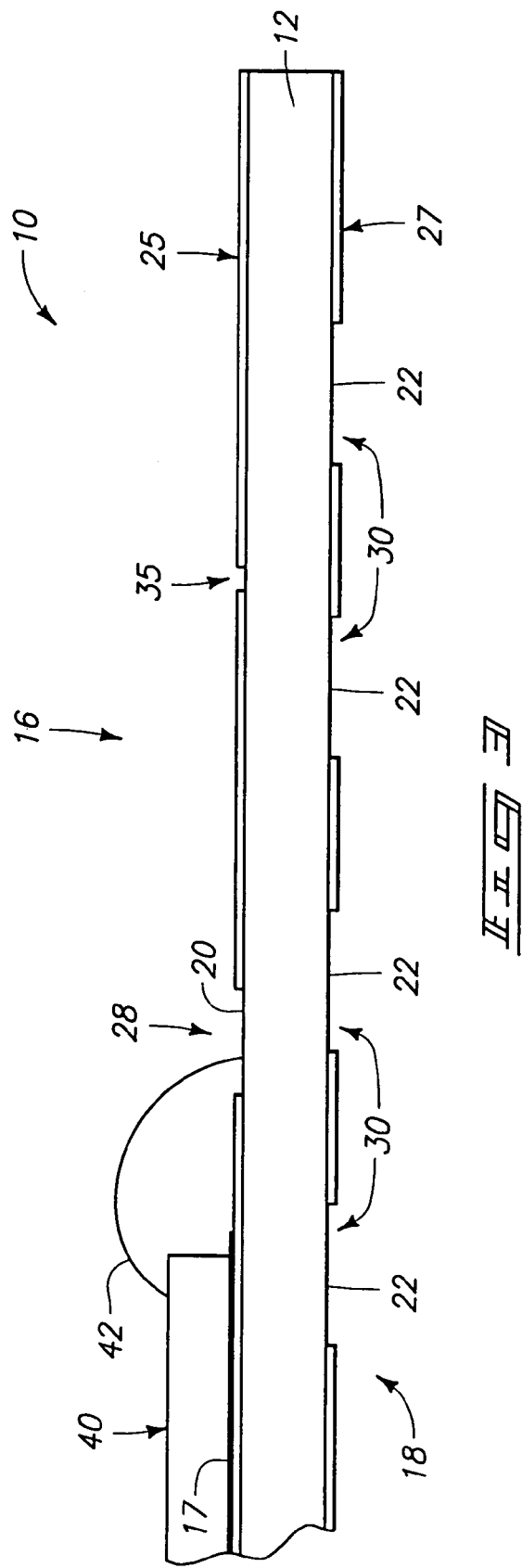
FIG. 3 is an enlarged diagrammatic sectional view of a portion of the FIGS. 1 and 2 substrate at one point in a transfer mold process in accordance with an aspect of the invention.

Various aspects of the invention are described with reference to FIGS. 1–5. Referring initially to FIGS. 1–3, a circuit substrate is indicated generally with reference numeral 10. Such comprises a substrate 12, for example conventional or yet-to-be-developed printed circuit board or other rigid or flexible material. FIGS. 1 and 2 show substrate 12 in the form of an elongated strip of material yet to be singulated. Outlying line 14 shows in the preferred described embodiment the resultant singulated outline of what will be the completed package upon singulation from the strip. FIG. 1 effectively diagrammatically shows the mask openings for the soldermask layer, to be described subsequently. FIG. 2 shows the effective openings from the soldermask within the singulated outline 14 and, as well, shows exemplary circuit traces.

Substrate 12 comprises opposing sides 16 and 18, at least one of which has conductive traces formed thereon. The described preferred embodiment is in connection with fabrication of a ball grid array package, and with conductive traces being formed on each of sides 16 and 18. FIGS. 2 and 3 depict exemplary conductive traces 20 formed on substrate side 16, with FIG. 3 depicting exemplary circuit traces 22 formed on substrate side 18. In the depicted preferred example, substrate side 16 is configured for transfer mold packaging, for example in the exemplary method as described below.

A soldermask 25 is received on substrate side 16 and a soldermask 27 is received on substrate side 18. Soldermask 25 has a plurality of openings 28 formed therethrough to locations on conductive traces 20. Soldermask 27 on substrate side 18 has various openings 30 formed therethrough to various locations on conductive traces 22.

Figure 7:
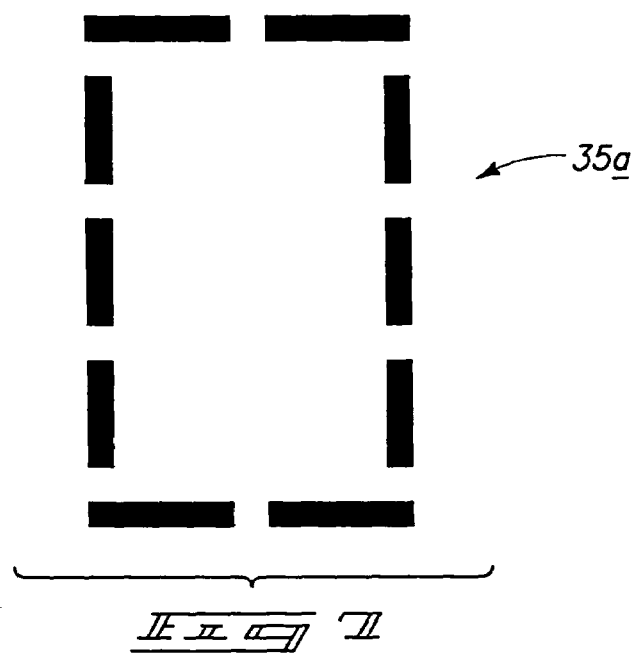
FIG. 7 is a diagrammatic top view of an alternate embodiment peripheral elongated trench to that depicted in FIG. 1.
Figure 8:
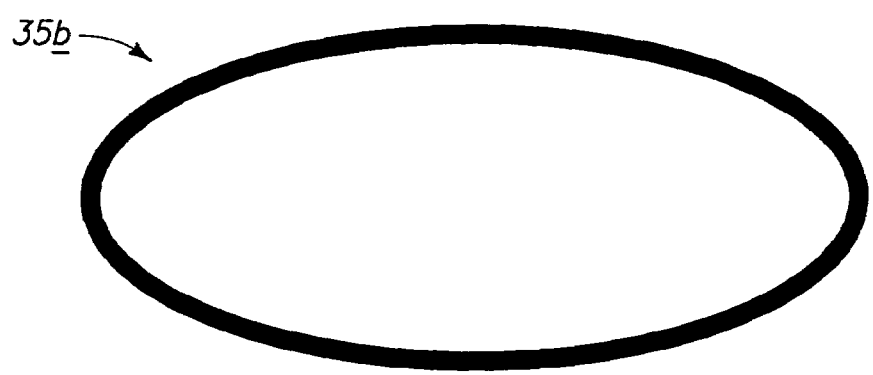
FIG. 8 is a diagrammatic top view of another alternate embodiment peripheral elongated trench to that depicted in FIG. 1.
Figure 9:
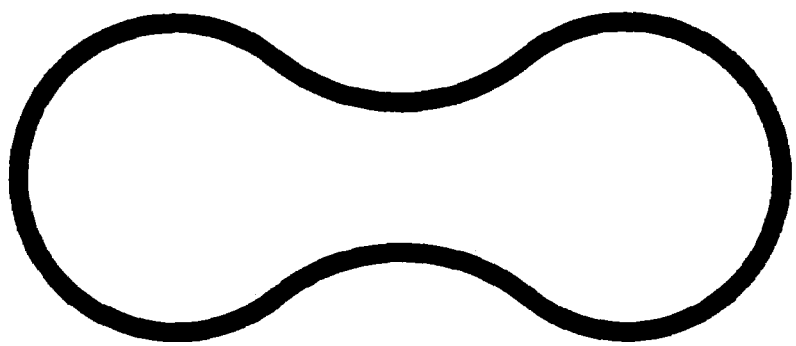
FIG. 9 is a diagrammatic top view of still another alternate embodiment peripheral elongated trench to that depicted in FIG. 1.

Soldermask 25 also comprises a peripheral elongated trench 35 therein. In the illustrated example, peripheral elongated trench 35 extends entirely through soldermask 25 to expose substrate side 16 therebeneath. Further in the preferred and illustrated embodiment, peripheral elongated trench 35 is continuous about a periphery defined by the radial outermost portions of elongated trench 35. Further in the preferred and illustrated embodiment, peripheral elongated trench 35 includes some straight linear segment, more preferably at least four straight linear segments, and most preferably at least eight straight linear segments. Eight straight linear segments 36 are shown in the exemplary embodiment. Such segments are preferably interconnected as shown, such that the peripheral elongated trench 35 is continuous (no breaks) about the periphery defined thereby. Less preferred would be discontinuities formed within trench 35 about the periphery, trench 35 not otherwise being formed entirely through soldermask 25, and/or other than straight linear segments. By way of example only, FIG. 7, FIG. 8 and FIG. 9 depict respective alternate embodiments 35a, 35b and 35c which include discontinuous and curved segments. Peripheral elongated trench 35 is positioned on substrate side 16 to align with at least a portion of an elongated mold void perimeter of a transfer mold to be used for transfer mold packaging of substrate side 16, as will be further described.

A semiconductor chip 40 is adhered (for example with a die attach adhesive 17) to substrate side 16, with soldermask 25 in the preferred embodiment being received between chip 40 and substrate 12. An exemplary bond wire 42 (FIG. 3) is shown interconnecting a portion of the circuitry on chip 40 with a location on circuit trace 20 through a soldermask opening 28.

Figure 4:
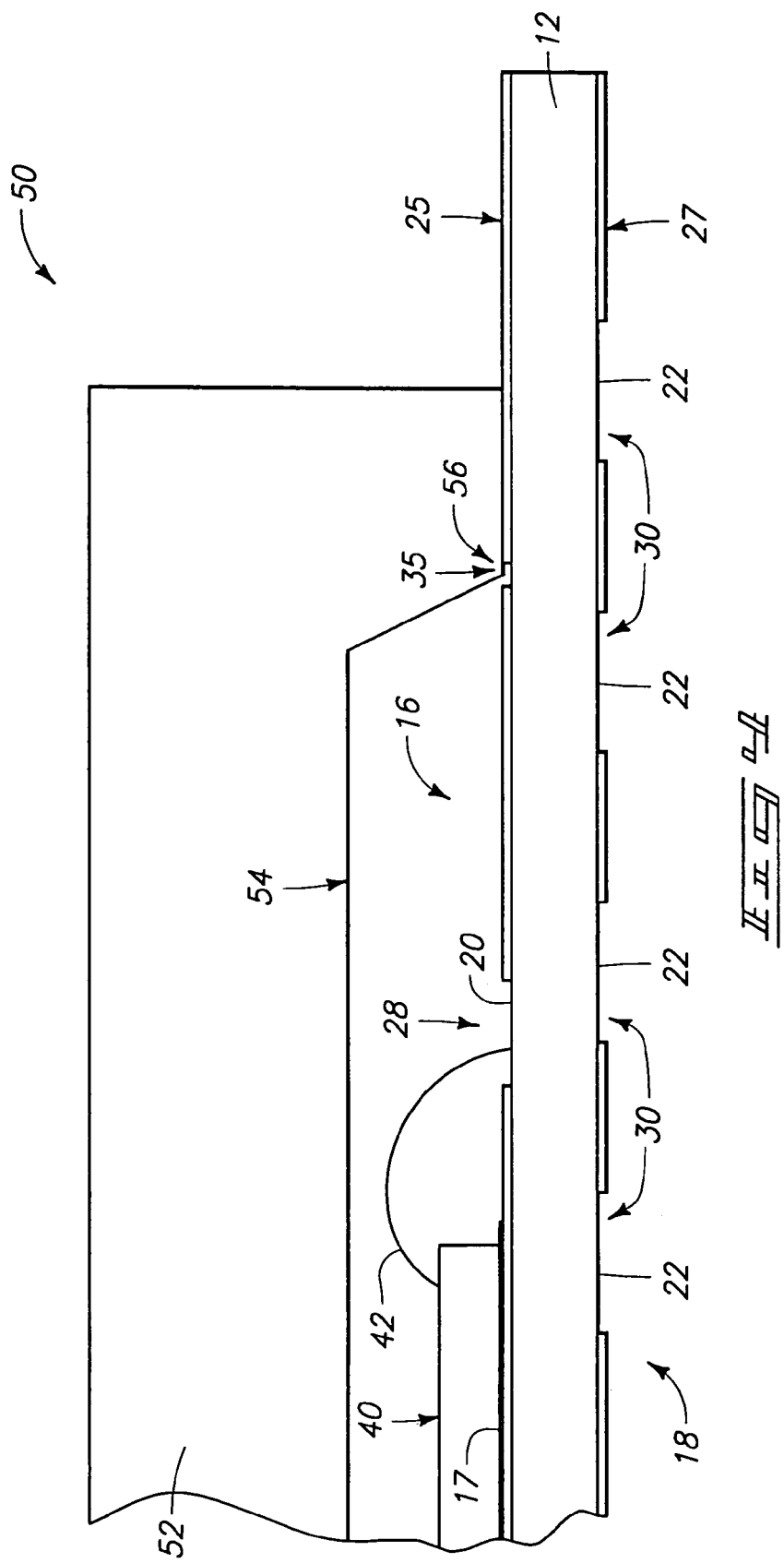
FIG. 4 is a diagrammatic sectional view of the FIG. 3 device at a processing step subsequent to that shown by FIG. 3.

Referring to FIG. 4, a transfer mold 50 is positioned to cover at least a portion of circuit substrate 12 having semiconductor chip 40 mounted thereto. Transfer mold 50 includes a mold body 52 having a void 54 within which semiconductor chip 40 is received. Void 54 includes a perimeter 56. Transfer mold 50 is positioned to align at least a portion of void perimeter 56 over at least a portion of soldermask peripheral trench 35. In the illustrated and preferred embodiment, the soldermask peripheral trench and perimeter are configured such that a positioning can occur, as shown, which aligns all of void perimeter 56 over all of soldermask peripheral trench 35. Further in the preferred embodiment as shown, the preferred positioning and alignment positions mold void perimeter 56 to substantially centrally align relative to the lateral confines of elongated soldermask trench 35.

Figure 5:
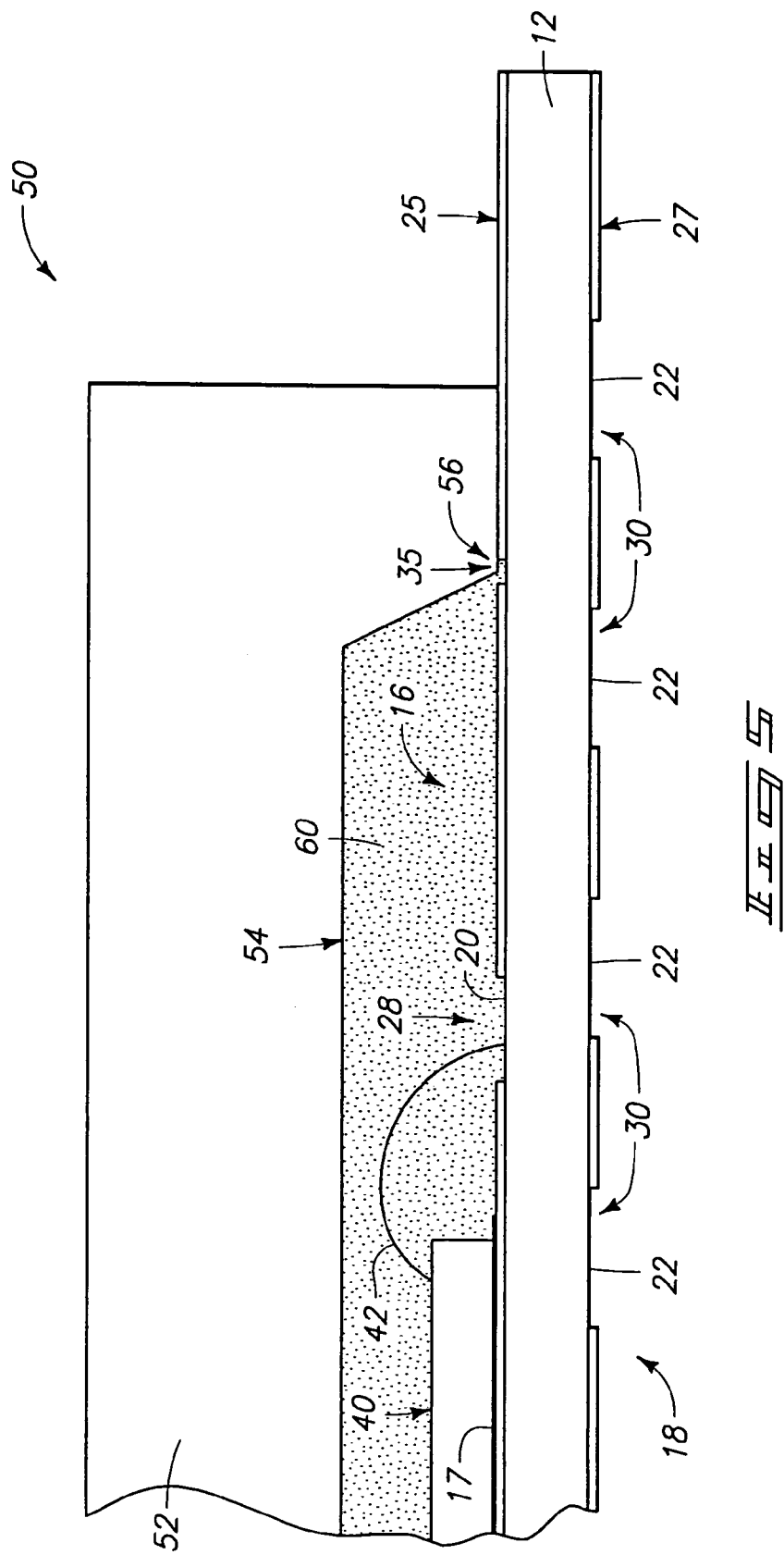
FIG. 5 is a diagrammatic sectional view of the FIG. 3 device at a processing step subsequent to that shown by FIG. 4.

Referring to FIG. 5, an encapsulant 60 is flowed into mold void 54 over semiconductor chip 40 and to within soldermask trench 35. Preferably as shown, insulative encapsulant 60 fills soldermask trench 35. The insulative encapsulant is allowed to cure into a solidified mass.

Figure 6:
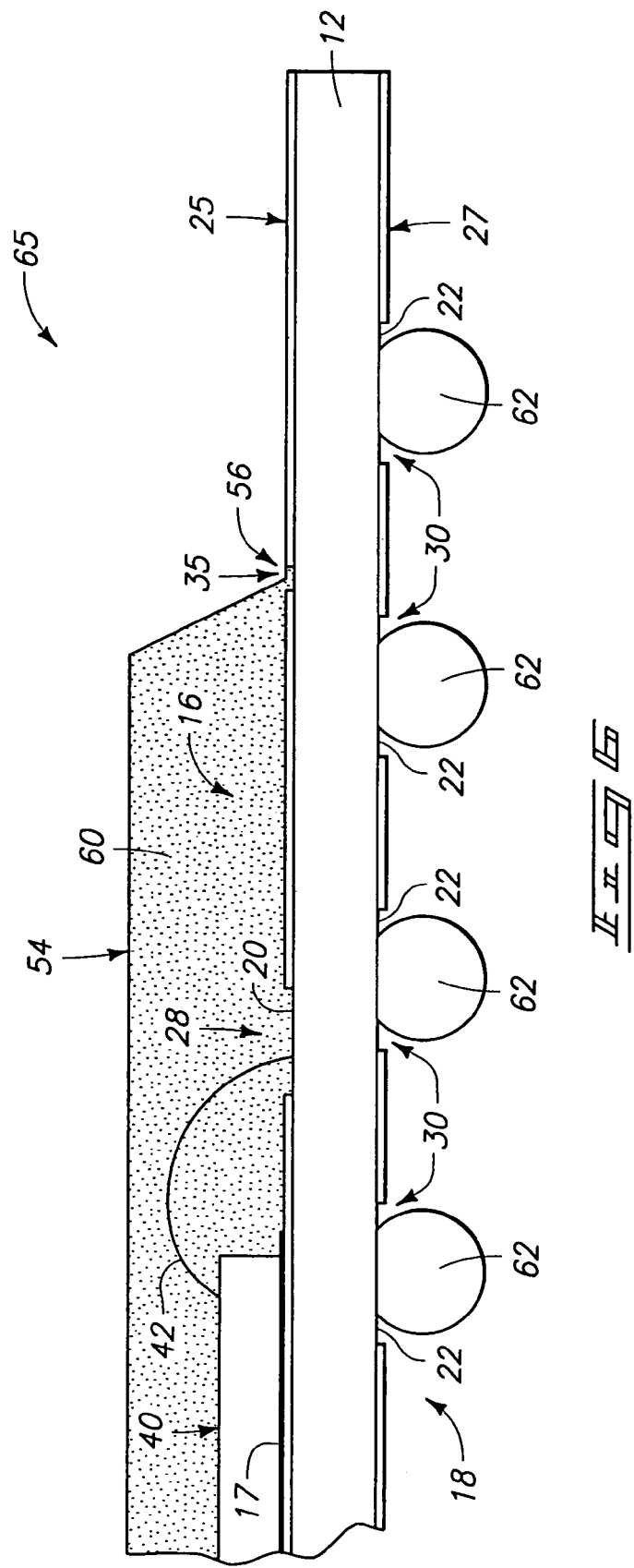
FIG. 6 is a diagrammatic sectional view of the FIG. 3 device at a processing step subsequent to that shown by FIG. 5.

FIG. 6 illustrates transfer mold 50 having been removed, and a plurality of solder balls 62 having been mounted through soldermask openings 30 to conductive traces 22 on substrate side 18. Thus, FIG. 6 illustrates an exemplary preferred semiconductor package 65 in the form of a ball grid array.

In the preferred embodiment, and not required of the claims unless literally worded therein, the elongated trench provides stress relief at the mold void perimeter such that cracking of present soldermask materials at this location can be advantageously avoided. Further, present encapsulant materials tend to better adhere to present circuit board materials than to present soldermask materials. Accordingly, the invention might provide better overall adhesion of the encapsulant to the underlying substrate due to added contact area of the encapsulant to board material by provision of the preferred soldermask trench to the substrate. By way of example only and in no way by way of limitation, exemplary existing circuit board materials are bismalimide triazine or FR-4; exemplary encapsulant material includes silica filled Novolac or phenolic resin epoxy molding compound; and exemplary soldermask materials are liquid or dry film photoimageable polyimide such as Taiyo PSR 4000 available from Taiyo Ink Mfg. Co. of Tokyo,. Japan.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A transfer mold semiconductor packaging process comprising:
   providing a circuit substrate having a semiconductor chip mounted to a side thereof, the circuit substrate having a soldermask on the side, the soldermask comprising an elongated outer peripheral trench;
   positioning a transfer mold to cover at least a portion of the circuit substrate having the semiconductor chip mounted thereto, the transfer mold having a void within which the semiconductor chip is received, the void having a perimeter edge, the positioning comprising aligning at least a portion of the void perimeter edge to overlap with at least a portion of the soldermask peripheral trench;
   flowing encapsulant into the mold void over the semiconductor chip and to within the soldermask trench; and
   after the flowing, curing the encapsulant into a solidified mass.

2. The process of claim 1 comprising providing the soldermask elongated outer peripheral trench to be continuous about a periphery.

3. The process of claim 1 comprising providing the soldermask elongated outer peripheral trench to be discontinuous about a periphery.

4. The process of claim 1 wherein the positioning aligns all of the void perimeter edge over at least a portion of the soldermask peripheral trench.

5. The process of claim 1 wherein the positioning aligns all of the soldermask peripheral trench over at least a portion of the void perimeter edge.

6. The process of claim 1 wherein the positioning aligns all of the void perimeter edge over all of the soldermask peripheral trench.

7. The process of claim 1 comprising providing the soldermask elongated outer peripheral trench to expose the circuit substrate.

8. The process of claim 1 wherein the soldermask is received intermediate the semiconductor chip and the circuit substrate.

9. The process of claim 1 wherein the positioning positions the mold void perimeter edge to substantially centrally align with the elongated soldermask trench.

10. A transfer mold semiconductor packaging process comprising:
    providing a circuit substrate having a semiconductor chip mounted to a side thereof, the circuit substrate having a soldermask on the side, the soldermask comprising a continuous elongated outer peripheral trench extending therethrough to the circuit substrate;
    positioning a transfer mold to cover at least a portion of the circuit substrate having the chip mounted thereto, the transfer mold having a void within which the semiconductor chip is received, the void having a perimeter edge, the positioning comprising aligning all of the void perimeter edge to overlap with all of the soldermask peripheral trench;
    flowing encapsulant into the mold void over the semiconductor chip and to within the soldermask trench; and
    after the flowing, curing the encapsulant into a solidified mass.

11. The process of claim 10 wherein the positioning positions the mold void perimeter edge to substantially centrally align with the elongated soldermask trench.

* * * * *